United States Patent
Komatsuda

(10) Patent No.: US 12,105,428 B2
(45) Date of Patent: Oct. 1, 2024

(54) IMAGE-FORMING OPTICAL SYSTEM, EXPOSURE APPARATUS, AND DEVICE PRODUCING METHOD

(71) Applicant: Nikon Corporation, Tokyo (JP)

(72) Inventor: Hideki Komatsuda, Ageo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 17/953,291

(22) Filed: Sep. 26, 2022

(65) Prior Publication Data

US 2023/0024028 A1 Jan. 26, 2023

Related U.S. Application Data

(60) Continuation of application No. 17/103,943, filed on Nov. 24, 2020, now Pat. No. 11,467,501, which is a
(Continued)

(30) Foreign Application Priority Data

Nov. 24, 2009 (JP) ................................. 2009-265912

(51) Int. Cl.
    *G03F 7/20* (2006.01)
    *G02B 17/06* (2006.01)
    *G03F 7/00* (2006.01)

(52) U.S. Cl.
    CPC ......... *G03F 7/702* (2013.01); *G02B 17/0657* (2013.01); *G03F 7/70033* (2013.01);
    (Continued)

(58) Field of Classification Search
    CPC .. G03F 7/702; G03F 7/70033; G03F 7/70091; G03F 7/70233; G03F 7/7025;
    (Continued)

(56) References Cited

U.S. PATENT DOCUMENTS

| 5,872,617 A | 2/1999 | Unno |
| 6,077,631 A | 6/2000 | Unno |

(Continued)

FOREIGN PATENT DOCUMENTS

| GB | 2347517 A | 9/2000 |
| JP | 2003-45784 A | 2/2003 |

(Continued)

OTHER PUBLICATIONS

International Search Report mailed Dec. 28, 2010, in International Application No. PCT/JP2010/070919.
(Continued)

*Primary Examiner* — Mesfin T Asfaw
(74) *Attorney, Agent, or Firm* — Potomac Law Group, PLLC

(57) ABSTRACT

There is provided a reflective image-forming optical system which is applicable to an exposure apparatus using, for example, EUV light and which is capable of increasing numerical aperture while enabling optical path separation of light fluxes. In a reflective imaging optical system (6) forming an image of a first plane (4) onto a second plane (7), the numerical aperture on a side of the second plane with respect to a first direction (X direction) on the second plane is greater than 1.1 times a numerical aperture on the side of the second plane with respect to a second direction (Y direction) crossing the first direction on the second plane. The reflecting imaging optical system has an aperture stop (AS) defining the numerical aperture on the side of the second plane, and the aperture stop has an elliptic-shaped opening of which size in a major axis direction (X direction) is greater than 1.1 times that in a minor axis direction (Y direction).

18 Claims, 13 Drawing Sheets

Related U.S. Application Data continuation of application No. 16/293,516, filed on Mar. 5, 2019, now Pat. No. 10,866,522, which is a continuation of application No. 15/923,858, filed on Mar. 16, 2018, now Pat. No. 10,228,623, which is a continuation of application No. 15/396,629, filed on Dec. 31, 2016, now Pat. No. 9,939,733, which is a division of application No. 13/511,797, filed as application No. PCT/JP2010/070919 on Nov. 24, 2010, now Pat. No. 9,557,548.

(52) U.S. Cl.
CPC ...... *G03F 7/70091* (2013.01); *G03F 7/70233* (2013.01); *G03F 7/7025* (2013.01)

(58) Field of Classification Search
CPC ......... G03F 7/20; G02B 17/0657; G02B 5/08; G02B 13/14; G02B 13/22; G02B 13/24; G02B 17/08; G03B 27/54
See application file for complete search history.

(56) References Cited

U.S. PATENT DOCUMENTS

| | | | |
|---|---|---|---|
| 6,452,661 | B1 | 9/2002 | Komatsuda |
| 7,312,851 | B2 | 12/2007 | Komatsuda et al. |
| 7,483,122 | B2 | 1/2009 | Komatsuda et al. |
| 9,557,548 | B2 | 1/2017 | Komatsuda |
| 10,228,623 | B2 | 3/2019 | Komatsuda |
| 2001/0003480 | A1 | 6/2001 | Ryuk et al. |
| 2003/0031017 | A1 | 2/2003 | Tsuji |
| 2005/0099614 | A1 | 5/2005 | Sugita et al. |
| 2005/0264787 | A1 | 12/2005 | Mann et al. |
| 2005/0270513 | A1 | 12/2005 | Dierichs et al. |
| 2006/0012767 | A1 | 1/2006 | Komatsuda et al. |
| 2006/0109436 | A1 | 5/2006 | Van Der Laan et al. |
| 2007/0058269 | A1 | 3/2007 | Mann et al. |
| 2007/0103789 | A1 | 5/2007 | Mulder |
| 2007/0223112 | A1 | 9/2007 | Mann et al. |
| 2008/0165426 | A1 | 7/2008 | Schuster |
| 2008/0259303 | A1 | 10/2008 | Ossmann et al. |
| 2008/0266686 | A1 | 10/2008 | Dengel |
| 2009/0046357 | A1 | 2/2009 | Mann et al. |
| 2009/0051890 | A1 | 2/2009 | Mann et al. |
| 2009/0052073 | A1 | 2/2009 | Mann et al. |
| 2009/0079952 | A1 | 3/2009 | Mann |
| 2009/0135510 | A1 | 5/2009 | Ono |
| 2009/0251677 | A1 | 10/2009 | Endres et al. |
| 2010/0134907 | A1 | 6/2010 | Mann et al. |
| 2013/0128248 | A1 | 5/2013 | Komatsuda et al. |
| 2013/0128251 | A1 | 5/2013 | Mann |
| 2014/0104588 | A1 | 4/2014 | Zellner et al. |

FOREIGN PATENT DOCUMENTS

| | | |
|---|---|---|
| JP | 2008-541439 A | 11/2008 |
| JP | 2009-532725 A | 9/2009 |
| JP | 2009-253048 A | 10/2009 |
| WO | WO 2004/010224 A2 | 1/2004 |
| WO | WO 2006/119977 A1 | 11/2006 |
| WO | WO 2007/115597 A1 | 10/2007 |

OTHER PUBLICATIONS

Written Opinion of International Searching Authority mailed Dec. 28, 2010, in International Application No. PCT/JP2010/070919.
Office Action issued Sep. 2, 2014, in Japanese Patent Application No. 2011-543267.
Office Action issued Mar. 23, 2015, in Japanese Patent Application No. 2011-543267.
Notice of Reasons for Rejection of Japanese Patent Application No. 2015-124424 dated Jun. 7, 2016.
Non-Final Office Action dated Apr. 7, 2014, in U.S. Appl. No. 13/511,797.
Non-Final Office Action dated Oct. 30, 2014, in U.S. Appl. No. 13/511,797.
Notice of Allowance dated Mar. 18, 2015, in U.S. Appl. No. 13/511,797.
Notice of Allowance dated Jul. 8, 2015, in U.S. Appl. No. 13/511,797.
Non-Final Office Action dated Aug. 5, 2015, in U.S. Appl. No. 13/511,797.
Notice of Allowance dated Feb. 1, 2016, in U.S. Appl. No. 13/511,797.
Notice of Allowance dated May 25, 2016, in U.S. Appl. No. 13/511,797.
Notice of Allowance dated Sep. 8, 2016, in U.S. Appl. No. 13/511,797.
Extended European Search Report issued Nov. 16, 2017, in European Patent Application No. 10833220.6.
Office Action issued Apr. 30, 2021, in European Patent Application No. 10833220.6.
Office Action issued Nov. 30, 2017, in Korean Patent Application No. 10-2012-7000029.
Notice of Allowance dated Dec. 11, 2017, in U.S. Appl. No. 15/396,629.
Notice of Allowance dated Aug. 14, 2017, in U.S. Appl. No. 15/396,629.
Non-Final Office Action dated Apr. 4, 2017, in U.S. Appl. No. 15/396,629.
Notice of Allowance dated Oct. 31, 2018, in U.S. Appl. No. 15/923,858.
Non-Final Office Action dated May 14, 2018, in U.S. Appl. No. 15/923,858.
Non-Final Office Action dated Oct. 10, 2019, in U.S. Appl. No. 16/293,516.
Final Office Action dated Mar. 23, 2020, in U.S. Appl. No. 16/293,516.
Advisory Action dated Jul. 10, 2020, in U.S. Appl. No. 16/293,516.
Notice of Allowance dated Aug. 12, 2020, in U.S. Appl. No. 16/293,516.
Non-Final Office Action dated Sep. 21, 2021, in U.S. Appl. No. 17/103,943.
Notice of Allowance dated Jun. 2, 2022, in U.S. Appl. No. 17/103,943.
Office Action issued Oct. 2, 2023, in European Patent Application No. 10833220.6.
Extended European Search Report issued Aug. 6, 2024, in European Patent Application No. 24168027.1.

Fig. 2
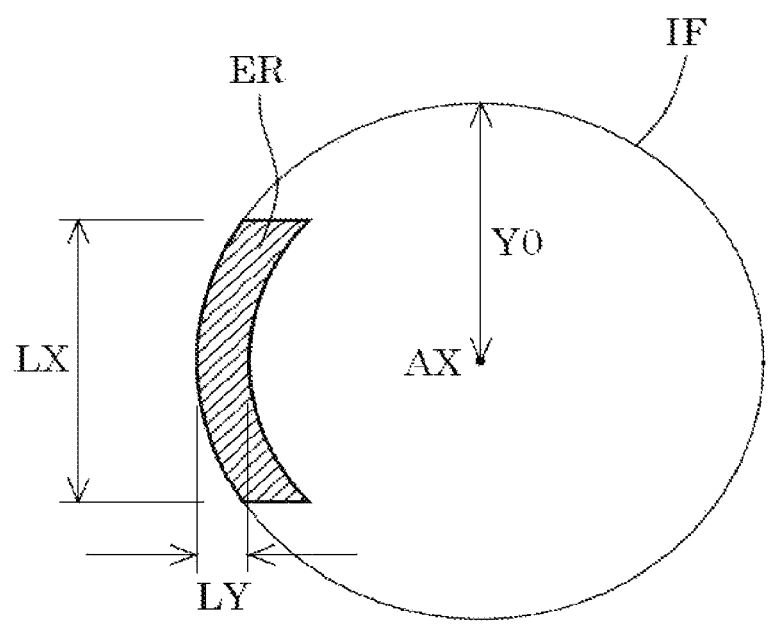
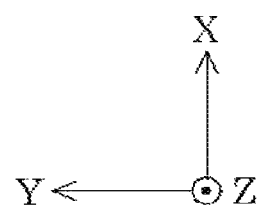

IMAGE-FORMING OPTICAL SYSTEM, EXPOSURE APPARATUS, AND DEVICE PRODUCING METHOD

TECHNICAL FIELD

The present invention relates to an imaging optical system, an exposure apparatus, and a method for producing a device. More specifically, the present invention relates to a reflective (catoptric) imaging optical system preferably useable for an exposure apparatus which is used to produce devices such as semiconductors, imaging elements, liquid display devices, thin-film magnetic heads, etc. in a lithography step.

BACKGROUND ART

Conventionally, in an exposure apparatus which is used to produce semiconductors, etc., a circuit pattern formed on a mask (reticle) is projected and transferred onto a photosensitive substrate (for example, a wafer) via a projection optical system. Resist is coated on the photosensitive substrate, is exposed by being subjected to the projection exposure via the projection optical system, and thus a pattern of the resist (resist pattern) corresponding to a pattern of the mask (mask pattern) is obtained. The resolving power (resolution) of the exposure apparatus depends on the wavelength of an exposure light (exposure light beam) and the numerical aperture of the projection optical system. Therefore, in order to improve the resolving power of the exposure apparatus, it is required to shorten the wavelength of the exposure light and to increase the numerical aperture of the projection optical system.

Increasing the numerical aperture of the projection optical system to be not less than a predetermined value is generally difficult in view of the optical design. Therefore, it is necessary to shorten the wavelength of the exposure light. In view of this, attention is directed to an EUVL (Extreme UltraViolet Lithography) technique as a next-generation exposure technique (exposure apparatus) to be used for patterning semiconductor elements. The EUVL exposure apparatus uses an EUV light (Extreme UltraViolet light or light beam) having a wavelength of, for example, about 5 nm to about 40 nm. In a case that the EUV light is used as the exposure light, any usable light-transmissive optical material is absent. Therefore, in the EUVL exposure apparatus, a reflection type mask is used, and a reflective optical system is used as an illumination optical system and a projection optical system (see, for example, Patent Literature 1).

CITATION LIST

Patent Literature

PATENT LITERATURE 1: U.S. Pat. No. 6,452,661

SUMMARY OF THE INVENTION

Problem to be Solved by the Invention

As described above, since the resolving power of the projection optical system (imaging optical system) is proportional to the numerical aperture, it is desirable to secure the numerical aperture of the projection optical system to be as large as possible so as to accurately transfer a minute or fine pattern onto a photosensitive substrate. However, the projection optical system which is used in the EUVL exposure apparatus is a reflective optical system, and thus the light is folded many times, by a plurality of reflecting mirrors, in the optical path between the mask and the photosensitive substrate, which in turn makes it difficult to increase the numerical aperture of the projection optical system, due to the purpose of realizing optical path separation for a plurality of light fluxes travelling in a relatively small or narrow space between the mask and the photosensitive substrate.

The present invention has been made taking the foregoing problem into consideration, an object of which is to provide a reflective imaging optical system which is applicable, for example, to an exposure apparatus using the EUV light and which is capable of realizing increased numerical aperture while realizing the optical path separation. Further, another object of the present invention is to perform the projection exposure at a high resolution and to secure a large resolving power by using, for example, the EUV light as the exposure light, with the application of the imaging optical system of the present invention to a projection optical system of an exposure apparatus.

Solution to the Problem

In order to solve the problem as described above, according to a first aspect of the present invention, there is provided a reflective imaging optical system which forms, on a second plane, an image of a first plane; characterized in that a numerical aperture, on a side of the second plane, with respect to a first direction on the second plane is greater than 1.1 times a numerical aperture, on the side of the second plane, with respect to a second direction crossing the first direction on the second plane.

According to a second aspect of the present invention, there is provided a reflective imaging optical system which forms, on a second plane, an image of a first plane; characterized in that a numerical aperture, on a side of the second plane, with respect to a first direction on the second plane is greater than 1.5 times a numerical aperture, on the side of the second plane, with respect to a second direction crossing the first direction on the second plane.

According to a third aspect of the present invention, there is provided a reflective imaging optical system which forms, on a second plane, an image of a first plane, characterized by comprising an aperture stop which defines a numerical aperture on a side of the second plane; wherein the aperture stop has an elliptic-shaped opening, and a size of the elliptic-shaped opening in a major axis direction is greater than 1.1 times a size of the elliptic-shaped opening in a minor axis direction.

According to a fourth aspect of the present invention, there is provided an exposure apparatus characterized by comprising: an illumination system which illuminates, with a light from a light source, a predetermined pattern arranged on the first plane; and the reflective imaging optical system of the first, second or third aspect which projects the predetermined pattern onto a photosensitive substrate arranged on the second plane.

According to a fifth aspect of the present invention, there is provided a method for producing a device, the method characterized by comprising the steps of: exposing the photosensitive substrate with the predetermined pattern by using the exposure apparatus of the fourth aspect; developing the photosensitive substrate to which the predetermined pattern has been transferred to form a mask layer, having a shape corresponding to the predetermined pattern, on a surface of the photosensitive substrate; and processing the surface of the photosensitive substrate via the mask layer.

Effect of the Invention

In the imaging optical system according to an embodiment of the present invention, the elliptic-shaped opening, having the minor axis in a folding direction in which the light flux is folded by a plurality of reflecting mirrors, is provided on the aperture stop, and the size of the major axis of the elliptic-shaped opening is set to be a predetermined time(s) of the size of the minor axis, thereby increasing the numerical aperture on the image side with respect to the major axis direction to be a desired size (value), as compared with the conventional technique. Namely, in this embodiment, there is realized a reflective imaging optical system which is applicable, for example to an exposure apparatus using the EUV light and which is capable of realizing increased numerical aperture while realizing the optical path separation of the light flux.

In a case that the imaging optical system of the embodiment is applied to the exposure apparatus, the EUV light, which has a wavelength of, for example, 5 nm to 40 nm, can be used as the exposure light. In this case, a pattern of the mask which is to be projected and the photosensitive substrate are moved relative to the imaging optical system, thereby making it possible that the pattern of the mask is projected onto the photosensitive substrate to expose the photosensitive substrate therewith at a high resolution. As a result, a highly precise device can be produced under a satisfactory exposure condition by using a scanning type exposure apparatus having a large resolving power.

BRIEF DESCRIPTION OF THE DRAWINGS

FIG. 2 shows a positional relationship between an optical axis and a circular arc-shaped effective imaging area formed on a wafer;

EMBODIMENTS FOR CARRYING OUT THE INVENTION

Figure 1:
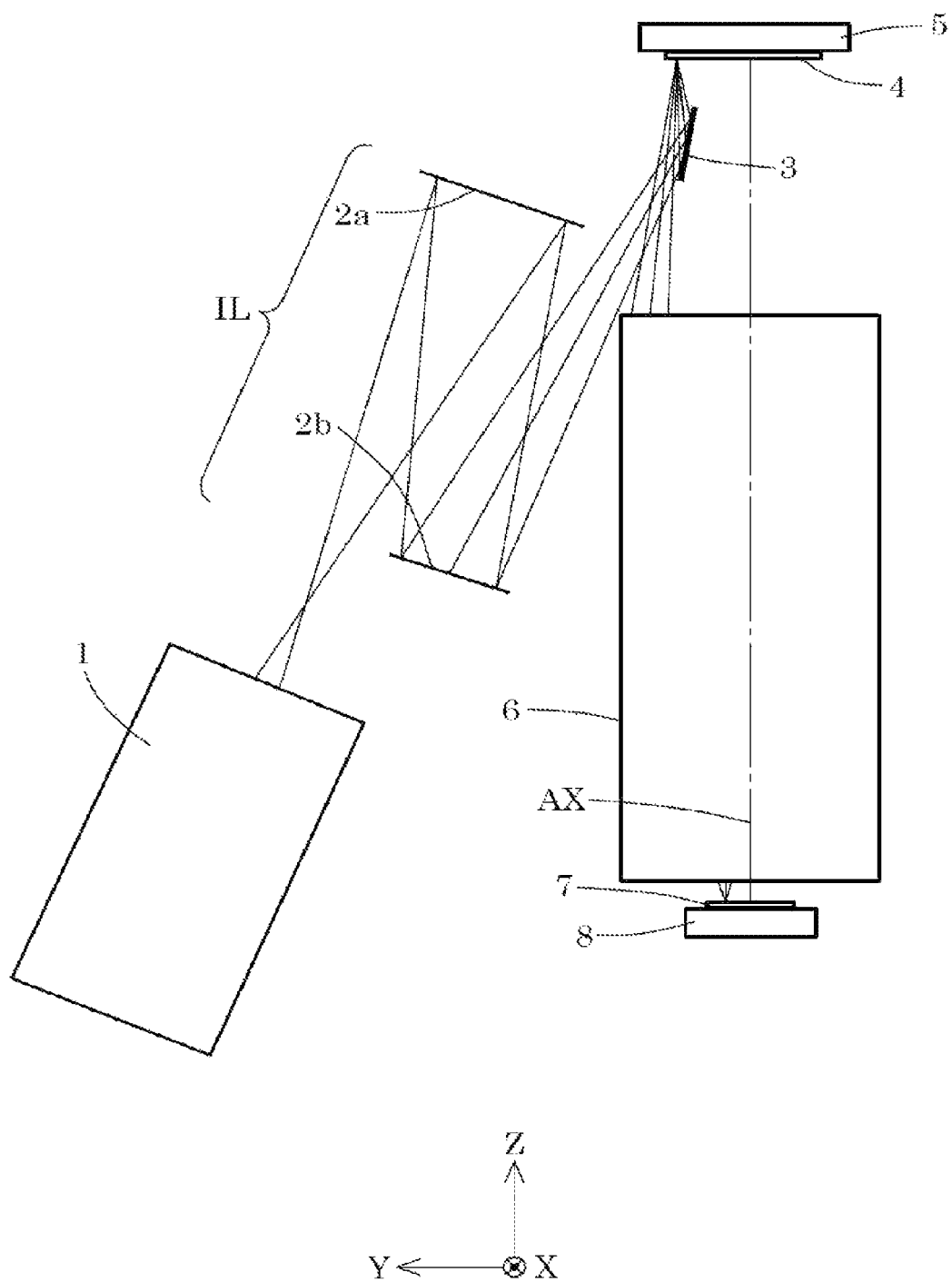
FIG. 1 schematically shows a construction of an exposure apparatus according to an embodiment of the present invention.

An embodiment of the present invention will be explained based on the accompanying drawings. FIG. 1 schematically shows a construction of an exposure apparatus according to the embodiment of the present invention. FIG. 2 shows a positional relationship between the optical axis and a circular arc-shaped effective imaging area formed on a wafer. In FIG. 1, the Z axis is defined in the direction of the optical axis AX of a reflective imaging optical system (hereinafter referred also simply as "imaging optical system") 6, i.e., in the normal line direction of an exposure surface (transfer surface) of a wafer 7 provided as a photosensitive substrate, the Y axis is defined in the direction parallel to the sheet surface of FIG. 1 in the exposure surface of the wafer 7, and the X axis is defined in the direction perpendicular to the sheet surface of FIG. 1 in the exposure surface of the wafer 7.

The exposure apparatus shown in FIG. 1 is provided with, for example, a laser plasma X-ray source as a light source 1 which is provided to supply the exposure light. It is allowable to use, as the light source 1, discharge plasma light sources and other X-ray sources. The light (light beam) radiated from the light source 1 comes into an illumination optical system IL, via an optionally arranged wavelength selection filter (not shown). The wavelength selection filter has such a characteristic that only the EUV light having a predetermined wavelength (for example, 13.5 nm), which is included in the lights supplied by the light source 1, is selectively transmitted through the wavelength selection filter, and the transmission of the lights having other wavelengths is shielded or shut off by the wavelength selection filter. The EUV light via (which is allowed to pass through) the wavelength selection filter is guided to an optical integrator which is constructed of a pair of fly's eye optical systems (fly's eye mirrors) 2a, 2b.

The first fly's eye optical system 2a has a plurality of first reflecting optical elements which are arranged in juxtaposition or in parallel. The second fly's eye optical system 2b has a plurality of second reflecting optical elements which are arranged in juxtaposition or in parallel to correspond to the plurality of first reflecting optical elements of the first fly's eye optical system 2a. Specifically, the first fly's eye optical system 2a is constructed, for example, by arranging a large number of concave mirror elements, having circular arc-shaped outer shapes, densely, laterally and longitudinally in a plane optically conjugate with the first plane. The second fly's eye optical system 2b is constructed, for example, by arranging a large number of concave mirror elements, which have rectangular outer shapes, densely, laterally and longitudinally in the exit pupil plane or a plane optically conjugate with the exit pupil plane. Reference may be made, for example, to the specification of U.S. Pat. No. 6,452,661 about detailed construction and function of the fly's eye optical systems 2a, 2b.

Thus, a substantial surface light source, which has a predetermined shape, is formed in the vicinity of the reflecting surface of the second fly's eye optical system 2b. The substantial surface light source is formed at the position of the exit pupil (exit pupil position) of the illumination optical system IL constructed of the pair of fly's eye optical systems 2a, 2b. The exit pupil position of the illumination optical system IL (i.e., the position in the vicinity of the reflecting surface of the second fly's eye optical system 2b) is coincident with the position of the entrance pupil of the imaging optical system (projection optical system) 6 of the far pupil type. The imaging optical system of the far pupil type is an imaging optical system which has the entrance pupil on the side opposite to the optical system with the object plane intervening therebetween, as will be discussed later. In this embodiment, since the shape of the entrance pupil of the projection optical system 6 is elliptic-shaped, it is possible, for example, to make the shape of the exit pupil of the illumination optical system to be elliptic-shaped. In such a case, it is possible to reduce the light loss (optical loss).

In other words, the exit pupil of the illumination optical system IL is allowed to have such a shape that the size (dimension) in a third direction on the exit pupil plane, at which the exit pupil is located, is smaller than the size (dimension) in a fourth direction crossing the third direction on the exit pupil plane. In this case, the third direction can optically correspond to the first direction (X direction) in which the numerical aperture, of the imaging optical system 6, on the side of the second plane is large; and the fourth direction can optically correspond to the second direction (Y direction) in which the numerical aperture, of the imaging optical system 6, on the side of the second plane is small. Here, the phrase that "the first direction and the third direction correspond optically" can be considered that the first direction and the third direction are coincident with each other when considering the transformation of projective relationship by the optical system intervening in a space starting from the exit pupil plane of the illumination optical system IL and arriving at the second plane; and the phrase that "the second direction and the fourth direction correspond optically" can be considered that the second direction and the fourth direction are coincident with each other when considering the transformation of projective relationship by the optical system intervening in a space starting from the exit pupil plane of the illumination optical system IL and arriving at the second plane.

Further, the plurality of optical elements of the second fly's eye optical system 2b can be arranged only at a region (area) of which size or dimension in the fourth direction is greater than that in the third direction. For example, this region may be an elliptic-shaped region.

The light from the substantial surface light source, i.e., the light exiting or irradiated from the illumination optical system IL is reflected by an oblique incidence mirror 3, and then the light forms a circular arc-shaped illumination area on a reflection type mask 4 via a circular arc-shaped aperture (light-transmitting portion) of a field stop (not shown) which is arranged closely to the reflection type mask 4 substantially in parallel thereto. In this way, the light source 1 and the illumination optical system IL (2a, 2b) constitute an illumination system which is provided to perform the Koehler illumination for the mask 4 provided with a predetermined pattern. No reflecting mirror having any power is arranged in the optical path between the second fly's eye optical system 2b and the mask 4.

The mask 4 is held by a mask stage 5 which is movable in the Y direction so that the pattern surface of the mask 4 extends along the XY plane. The movement of the mask stage 5 is measured by a laser interferometer which is omitted from the illustration. For example, a circular arc-shaped illumination area, which is symmetrical in relation to the Y axis, is formed on the mask 4. The light, which comes from the illuminated mask 4, forms an image of the pattern (pattern image) of the mask 4 on a wafer 7 as a photosensitive substrate, via the imaging optical system 6.

That is, as shown in FIG. 2, a circular arc-shaped effective imaging area ER, which is symmetrical in relation to the Y axis, is formed on the wafer 7. With reference to FIG. 2, the circular arc-shaped effective imaging area ER, which has a length LX in the X direction and which has a length LY in the Y direction, is formed so that the circular arc-shaped effective imaging area ER is brought in contact with an image circle IF in the circular area (image circle) IF which has a radius Y0 about the center of the optical axis AX. The circular arc-shaped effective imaging area ER is a part of the annular or zonal area provided about the center of the optical axis AX. The length LY is the widthwise dimension of the effective imaging area ER provided in the direction connecting the optical axis and the center of the circular arc-shaped effective imaging area ER.

The wafer 7 is held by a wafer stage 8 which is two-dimensionally movable in the X direction and the Y direction so that the exposure surface of the wafer 7 extends along the XY plane. The movement of the wafer stage 8 is measured by a laser interferometer which is omitted from the illustration, in the same manner as the mask stage 5. Thus, the scanning exposure (scanning and exposure) is performed while moving the mask stage 5 and the wafer stage 8 in the Y direction, i.e., relatively moving the mask 4 and the wafer 7 in the Y direction with respect to the imaging optical system 6. By doing so, the pattern of the mask 4 is transferred to an exposure area of the wafer 7.

In a case that the projection magnification (transfer magnification) of the imaging optical system 6 is ¼, the synchronous scanning is performed by setting the movement velocity of the wafer stage 8 to ¼ of the movement velocity of the mask stage 5. The pattern of the mask 4 is successively transferred to the respective exposure areas of the wafer 7 by repeating the scanning exposure while two-dimensionally moving the wafer stage 8 in the X direction and the Y direction.

In specified embodiments of the embodiment, as shown in FIGS. 3, 4, 8 and 9, the imaging optical system 6 concerning each of specified embodiments includes, along the single optical axis AX extending in a form of straight line, a first reflective optical system G1 which forms an intermediate image of the pattern at a position optically conjugate with the pattern surface of the mask 4, and a second reflective optical system G2 which forms, on the wafer 7, a final reduced image (image of the intermediate image) of the pattern of the mask 4. That is, the plane, which is optically conjugate with the pattern surface of the mask 4, is formed in the optical path between the first reflective optical system G1 and the second reflective optical system G2.

The first reflective optical system G1 includes a first reflecting mirror M1 which has a concave (concave surface-shaped) reflecting surface, a second reflecting mirror M2 which has a convex (convex surface-shaped) reflecting surface, a third reflecting mirror M3 which has a convex reflecting surface and a fourth reflecting mirror M4 which has a concave reflecting surface as referred to in an order of the incidence of the light. The second reflective optical system G2 includes a fifth reflecting mirror M5 which has a convex reflecting surface, and a sixth reflecting mirror M6 which has a concave reflecting surface as referred to in an order of the incidence of the light. An aperture stop AS, which has an elliptic-shaped opening elongated in the X direction, is provided on the optical path from the second reflecting mirror M2 and arriving at the third reflecting mirror M3. Any aperture stop is not arranged in the optical path of the imaging optical system 6 other than this aperture stop AS, and the numerical aperture of the imaging system 6 is determined only with the restriction or limiting of the light flux by the aperture stop AS.

In the respective specified embodiments, a light from an illumination area which is separated from the optical axis AX on the pattern surface of the mask 4 (first plane) is successively reflected by the concave-shaped reflecting surface of the first reflecting mirror M1, the convex-shaped reflecting surface of the second reflecting mirror M2, the convex-shaped reflecting surface of the third reflecting mirror M3 and the concave-shaped reflecting surface of the fourth reflecting mirror M4, and then the light forms the intermediate image of the mask pattern. The light from the intermediate image formed via the first reflective optical system G1 is successively reflected by the convex-shaped reflecting surface of the fifth reflecting mirror M5 and the concave-shaped reflecting surface of the sixth reflecting mirror M6, and then the light forms an reduced image of the mask pattern at an effective imaging area ER which is separated from the optical axis AX on the surface of the wafer 7 (second plane).

In the respective specified embodiments, all of the first to sixth reflecting mirrors M1 to M6 are formed to have the reflecting surfaces each of which is formed to have an aspherical reflecting surface rotationally symmetric in relation to the optical axis AX. The imaging optical system 6 concerning each of the specified embodiments is the reflective imaging optical system of the far pupil type which has the entrance pupil, at the position separated by a predetermined distance, on the side opposite to the imaging optical system 6 with the mask 4 intervening therebetween. Further, in the respective specified embodiments, the imaging optical system 6 is the optical system which is telecentric on the side of the wafer (on the side of the image). In other words, in the respective specified embodiments, the main light beam, which arrives at the respective positions on the image plane of the imaging optical system 6, is substantially perpendicular to the image plane. Owing to this construction, the imaging can be performed satisfactorily even when irregularities (protrusions and recesses) are present on the wafer within the depth of focus of the imaging optical system 6.

First Embodiment

Figure 3:
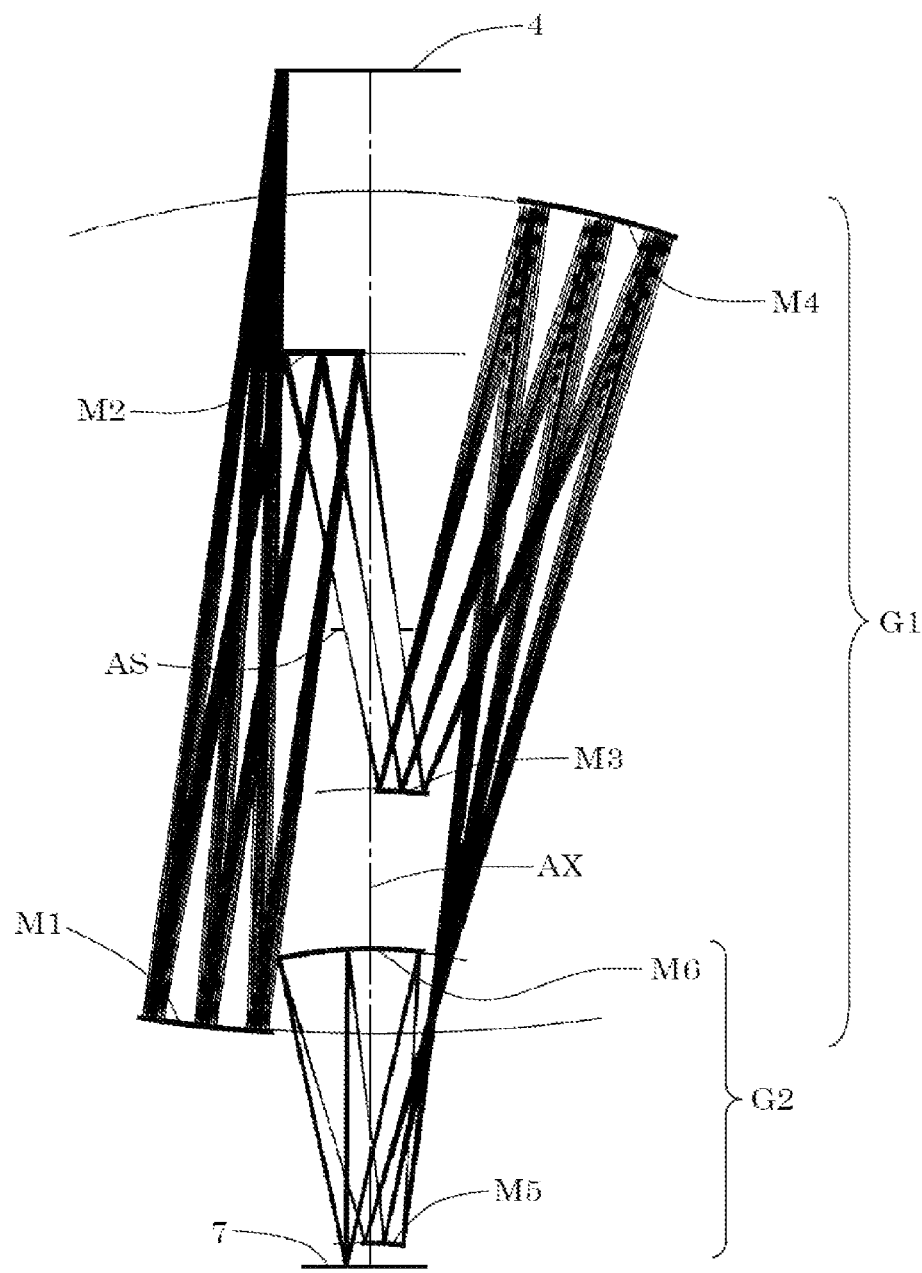
FIG. 3 schematically shows a construction along an YZ plane of an imaging optical system according to a first embodiment.
Figure 4:
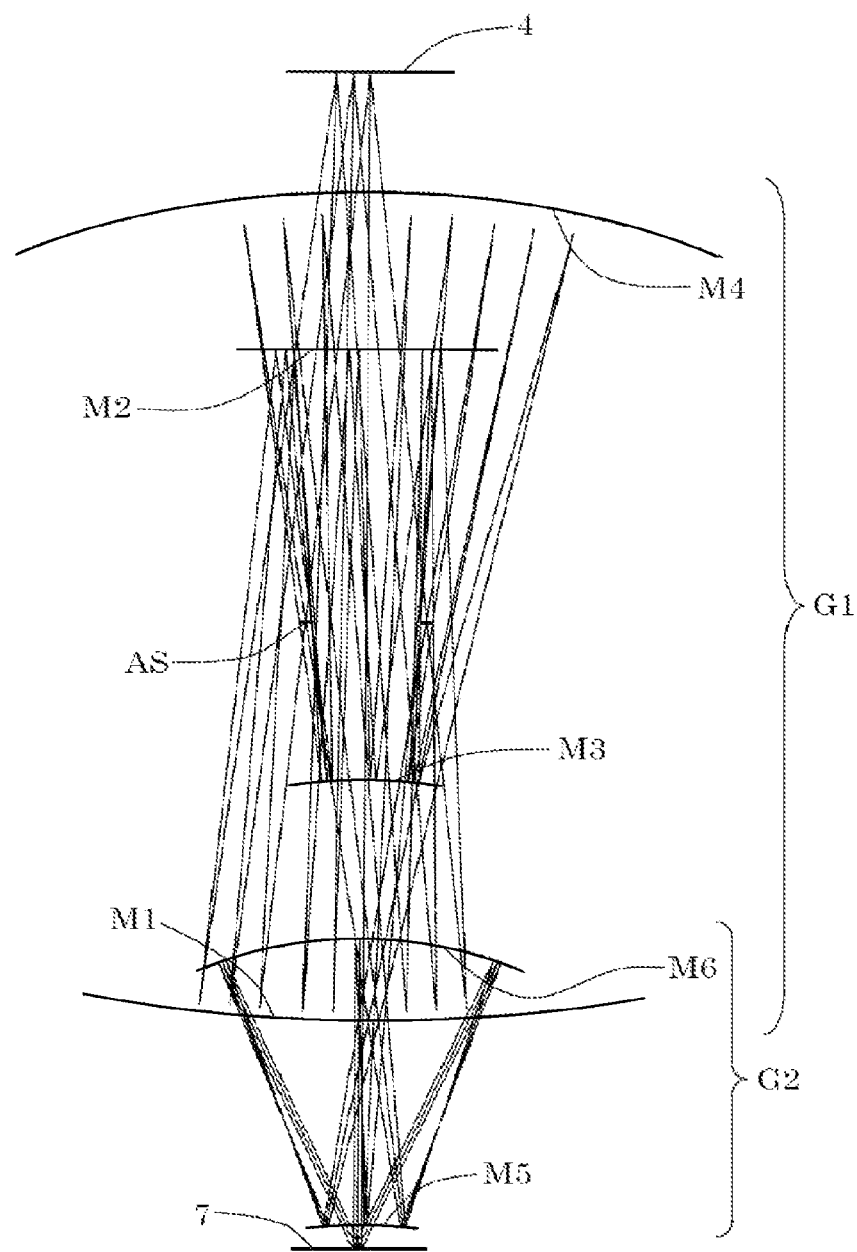
FIG. 4 schematically shows a construction along a XZ plane of the imaging optical system according to the first embodiment.

FIG. 3 schematically shows a construction along an YZ plane of the imaging optical system according to the first embodiment; and FIG. 4 schematically shows a construction along a XZ plane of the imaging optical system according to the first embodiment. In TABLE (1) described below shows values of items or elements of the imaging optical system according to the first embodiment. In the columns of the major items shown in TABLE (1), λ represents the wavelength of the exposure light, β represents the magnitude of the imaging magnification, NAx represents the numerical aperture on the image side (wafer side) in the X direction, NAy represents the numerical aperture on the image side (wafer side) in the Y direction, Y0 represents the radius (maximum image height) of the image circle IF on the wafer 7, LX represents the size or dimension in the X direction of the effective imaging area ER, LY represents the size or dimension in the Y direction of the effective imaging area ER (widthwise dimension of the circular arc-shaped effective imaging area ER), Dx represents the size or dimension in the X direction which is the major axis direction of the elliptic-shaped opening of the aperture stop AS, and Dy represents the size or dimension in the Y direction which is the minor axis direction of the elliptic-shaped opening of the aperture stop AS.

In TABLE (1), the column for set value of ray tracing and the column for lens data are described in accordance with the format of "Code V" that is an optical design software produced by ORA (Optical Research Associates). In the column for set value of ray tracing of TABLE (1), "DIM MM" indicates that the dimension is mm; "WL" indicates the wavelength of light (nm). Further, "XOB" indicates X-coordinate (unit: mm), on the wafer 7, of 15 pieces of lights (light beams) used for the ray tracing from the image side (wafer side); and "YOB" indicates Y-coordinate (unit: mm), on the wafer 7, of the 15 pieces of lights.

In the column for lens data in TABLE (1), "RDY" indicates the radius of curvature of surface (in a case of an aspherical surface, apical radius of curvature; unit: mm); "THI" indicates a distance from a certain surface to a next surface, namely spacing between surfaces (unit: mm); "RMD" indicates whether the certain surface is a reflecting surface or a refracting surface. "REFL" means a reflecting surface. "INFINITY" means the infinity, and if "RDY" is "INFINITY", this means that the surface is a flat surface. "OBJ" indicates a surface of the wafer 7 as the image plane, "STO" indicates a plane of the aperture stop AS, and "IMG" indicates a pattern surface of the mask 4, as the object plane.

Surface No. 1 indicates a virtual surface, Surface No. 2 indicates the reflecting surface of the sixth reflecting mirror M6, Surface No. 3 indicates the reflecting surface of the fifth reflecting mirror M5, Surface No. 4 indicates the reflecting surface of the fourth reflecting mirror M4, Surface No. 5 indicates the reflecting surface of the third reflecting mirror M3, Surface No. 7 indicates the reflecting surface of the second reflecting mirror M2, and Surface No. 8 indicates the reflecting surface of the first reflecting mirror M1. "ASP" indicates that the reflecting surface of each of the reflecting mirrors M1 to M6 is an aspherical surface expressed by Expression (a) shown below.

$$s = (h^2/r)/\left[1 + (1-(1+\kappa)\cdot h^2/r^2)^{1/2}\right] + C_4 \cdot h^4 + C_6 \cdot h^6 + C_8 \cdot h^8 \quad \text{(a)}$$
$$+ C_{10} \cdot h^{10} + C_{12} \cdot h^{12} + C_{14} \cdot h^{14} + C_{16} \cdot h^{16} + C_{18} \cdot h^{18} + C_{20} \cdot h^{20}$$

In Expression (a), "h" is a height (unit: mm) in a direction perpendicular to the optical axis; "s" is a distance (sag amount; unit: mm) along the optical axis from the tangent plane at the apex of aspherical surface to a position at the height "h" on the aspherical surface; "r" is the apical radius of curvature (unit: mm); "κ" is the constant of cone; and "$C_n$" is n-th asphericity. In the column for the lens data in TABLE (1), "κ" is the constant of cone κ; "A" is a coefficient $C_4$ of $h^4$; "B" is a coefficient $C_6$ of $h^6$; "C" is a coefficient $C_8$ of $h^8$; "D" is a coefficient $C_{10}$ of $h^{10}$; "E" is a coefficient $C_{12}$ of $h^{12}$; "F" is a coefficient $C_{14}$ of $h^{14}$; "G" is a coefficient $C_{16}$ of $h^{16}$; "H" is a coefficient $C_{18}$ of $h^{18}$; and "J" is a coefficient $C_{20}$ of $h^{20}$.

Further, "XDE", "YDE" and "ZDE" show the x-direction component (unit: mm), y-direction component (unit: mm) and z-direction component (unit: mm) of the eccentricity of surface, respectively, in each of the reflecting surfaces (Surface Nos.: 2, 3, 4, 5, 7, 8) of the reflecting mirrors M1 to M6. "ADE", "BDE" and "CDE" show the θx-direction component (rotational component about the X-axis; unit: degree), θy-direction component (rotational component about the Y-axis; unit: degree) and θz-direction component (rotational component about the Z-axis; unit: degree) of the rotation of the surface, respectively, in each of the reflecting surfaces (Surface Nos.: 2, 3, 4, 5, 7, 8) of the reflecting mirrors M1 to M6. Further, "DAR" means that a coordinate (X, Y, Z) of a surface, located after or downstream of a certain surface, does not change. Namely, if a certain surface indicated with "DAR" is eccentric, another surface(s) located after the certain surface does not follow the new, eccentric coordinate; and the eccentricity is unique to the certain surface indicated with "DAR". Note that the indication in TABLE (1) is also same as in TABLE (2) indicated below.

TABLE 1

| Major items: |
| --- |
| $\lambda$ = 13.5 nm |
| $\beta$ = ¼ |
| NAx = 0.4 |
| NAy = 0.2 |
| Y0 = 37 mm |
| LX = 26 mm |
| LY = 2 mm |
| Dx = 84.0838 mm |
| Dy = 41.6781 mm |

Set Value of Ray Tracing:

| DIM | MM | | | | |
| --- | --- | --- | --- | --- | --- |
| WL | 13.50 | | | | |
| XOB | 0.00000 | 0.00000 | 0.00000 | 0.00000 | 0.00000 |
|  | 6.50000 | 6.50000 | 6.50000 | 6.50000 | 6.50000 |
|  | 13.00000 | 13.00000 | 13.00000 | 13.00000 | 13.00000 |
| YOB | 37.00000 | 36.50000 | 36.00000 | 35.50000 | 35.00000 |
|  | 36.40833 | 35.90833 | 35.40833 | 34.90833 | 34.40833 |
|  | 34.57082 | 34.07082 | 33.57082 | 33.07082 | 32.57082 |

Lens Data:

| | RDY | THI | RMD |
| --- | --- | --- | --- |
| OBJ: | INFINITY | 0.000000 | |
| 1: | INFINITY | 528.623387 | |
| 2: | −592.28723 | −488.623387 | REFL |
| ASP: | | | |

K: 0.000000
A: −.254657E−10   B: −.111703E−15   C: −.366523E−21   D: −.105104E−26
E: −.614569E−32   F: 0.552344E−37   G: −.520745E−42   H: 0.000000E+00
J: 0.000000E+00
XDE: 0.000000   YDE: −0.135994   ZDE: 0.000000   DAR
ADE: 0.002819   BDE: 0.000000   CDE: 0.000000

| 3: | −685.82108 | 1758.023140 | REFL |
| --- | --- | --- | --- |
| ASP: | | | |

K: 0.000000
A: −.342613E−08   B: −.598557E−13   C: −.508202E−18   D: 0.257521E−21
E: −.629350E−25   F: 0.733153E−29   G: −.349548E−33   H: 0.000000E+00
J: 0.000000E+00
XDE: 0.000000   YDE: −0.159098   ZDE: 0.000000   DAR
ADE: 0.002117   BDE: 0.000000   CDE: 0.000000

| 4: | −1428.35928 | −999.904639 | REFL |
| --- | --- | --- | --- |
| ASP: | | | |

K: 0.000000
A: −.224179E−12   B: −.338584E−18   C: −.217996E−23   D: 0.151885E−28
E: −688940E−34   F: 0.153991E−39   G: −.139951E−45   H: 0.000000E+00
J: 0.000000E+00
XDE: 0.000000   YDE: 0.174976   ZDE: 0.000000   DAR
ADE: 0.011492   BDE: 0.000000   CDE: 0.000000

| 5: | −676.50202 | 265.439672 | REEL |
| --- | --- | --- | --- |
| ASP: | | | |

K: 0.000000
A: 0.128920E−08   B: −.707305E−15   C: 0.189300E−18   D: −.332017E−22
E: 0.330624E−26   F: −.178255E−30   G: 0.404070E−35   H: 0.000000E+00
J: 0.000000E+00
XDE: 0.000000   YDE:−0.075707   ZDE: 0.000000   DAR
ADE: 0.001504   BDE: 0.000000   CDE: 0.000000

| STO: | INFINITY | 464.183715 | |
| --- | --- | --- | --- |

TABLE 1-continued

| | | | |
|---|---|---|---|
| XDE: 0.000000 | YDE: 0.014383 | ZDE: 0.000000 | DAR |
| ADE: 0.000000 | BDE: 0.000000 | CDE: 0.000000 | |
| 7: | −9662.07987 | −1139.165307 | REFL |
| ASP: | | | |

| | | | |
|---|---|---|---|
| K: 0.000000 | | | |
| A: 0.168021E−09 | B: −.112219E−15 | C: 0.887751E−21 | D: 0.457673E−25 |
| E: −.216329E−29 | F: 0.450161E−34 | G: −.378974E−39 | H: 0.000000E+00 |
| J: 0.000000E+00 | | | |
| XDE: 0.000000 | YDE: 0.005654 | ZDE: 0.000000 | DAR |
| ADE: 0.007150 | BDE: 0.000000 | CDE: 0.000000 | |
| 8: | 2275.61649 | 1611.423419 | REEL |
| ASP: | | | |

| | | | |
|---|---|---|---|
| K: 0.000000 | | | |
| A: 0.726621E−11 | B: 0.832232E−18 | C: 0.251018E−22 | D: −.243698E−27 |
| E: 0.154171E−32 | F: −.547826E−38 | G: 0.830853E−44 | H: 0.000000E+00 |
| J: 0.000000E+00 | | | |
| XDE: 0.000000 | YDE: −0.029638 | ZDE: 0.000000 | DAR |
| ADE: 0.009792 | BDE: 0.000000 | CDE: 0.000000 | |
| IMG: | INFINITY | 0.000000 | |
| XDE: 0.000000 | YDE: 0.969601 | ZDE: 0.000000 | DAR |
| ADE: 0.000000 | BDE: 0.000000 | CDE: 0.000000 | |

Figure 5:
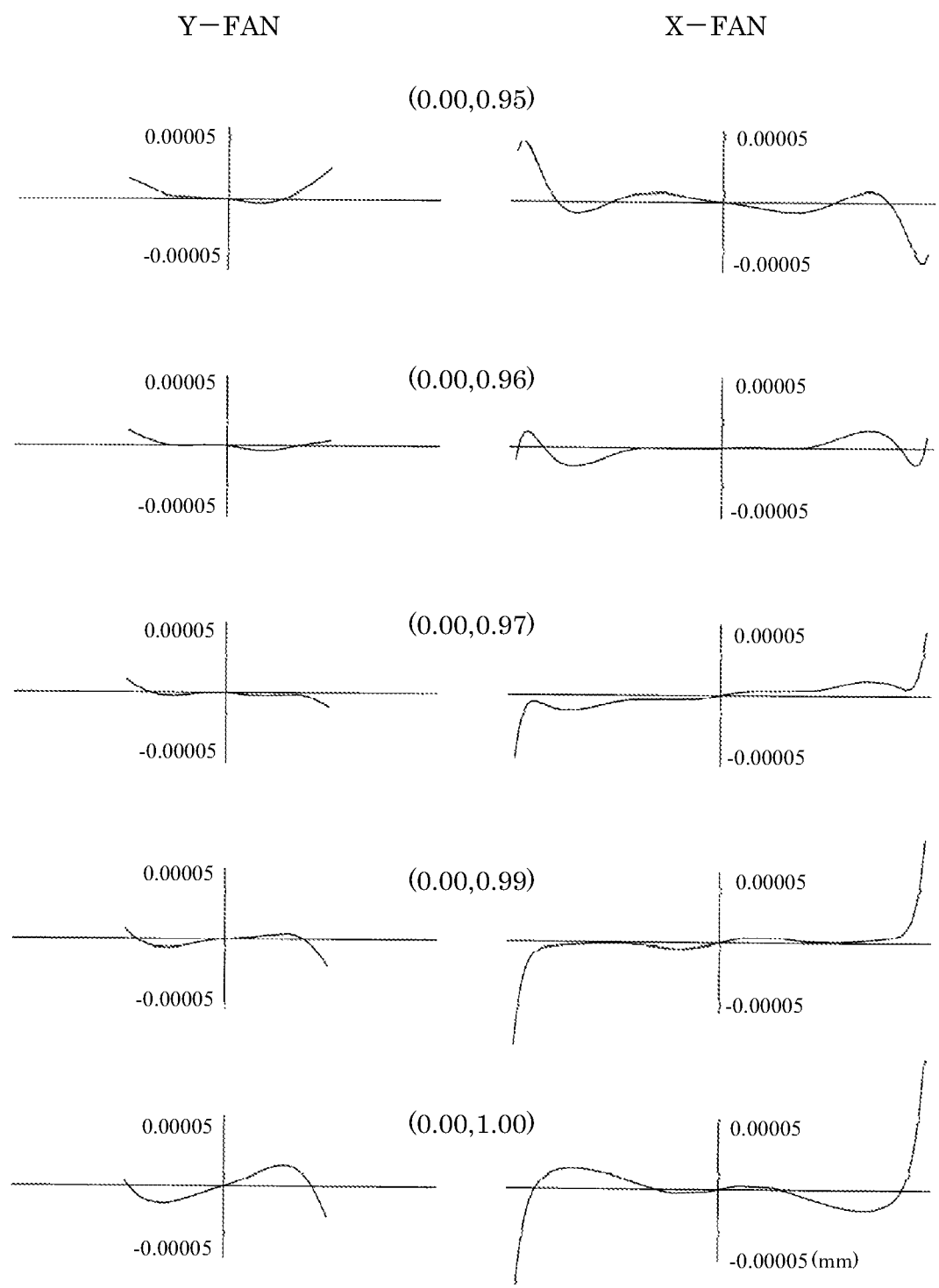
FIG. 5 is a first diagram showing the lateral aberration in the first embodiment.
Figure 6:
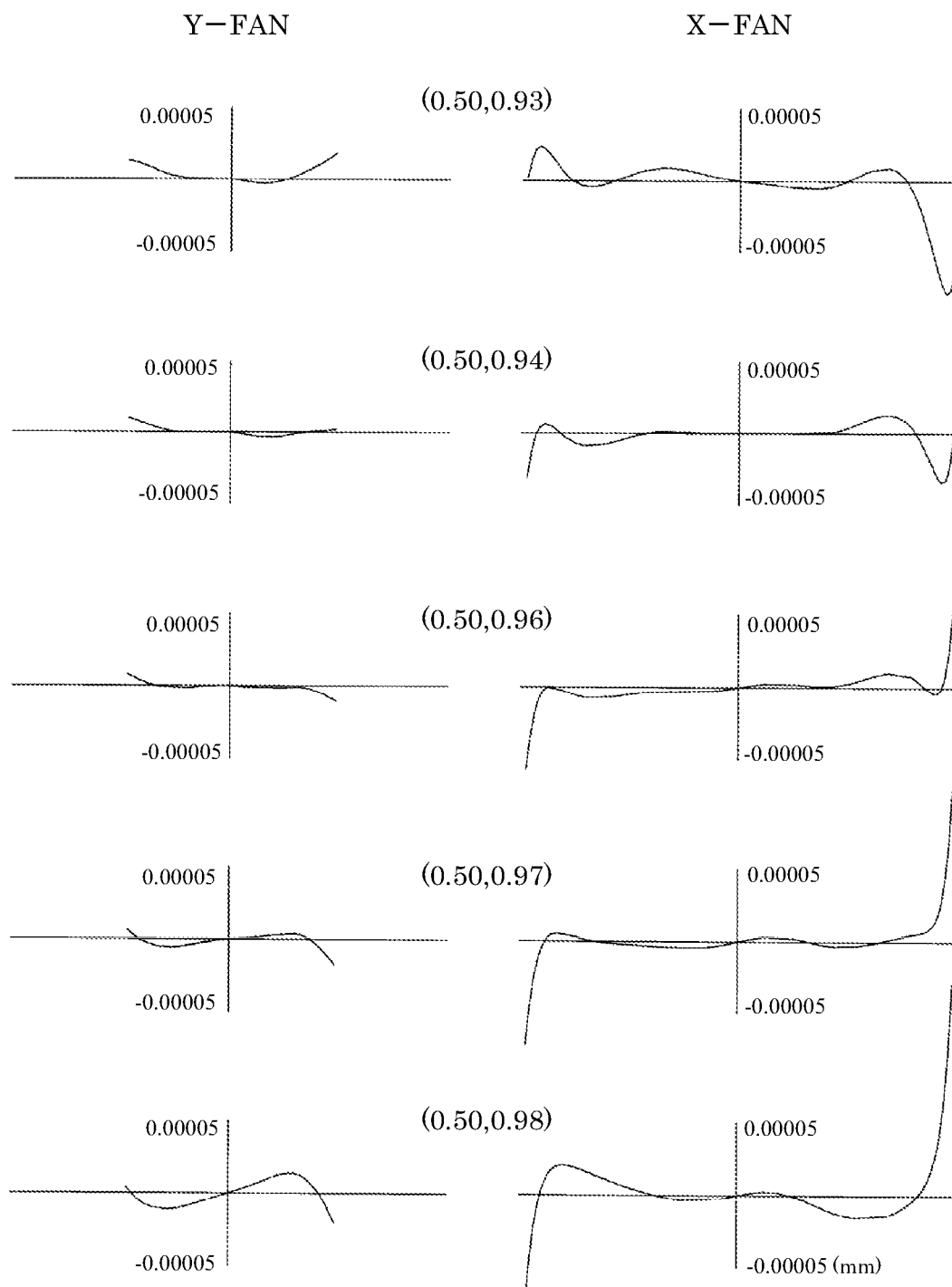
FIG. 6 is a second diagram showing the lateral aberration in the first embodiment.
Figure 7:
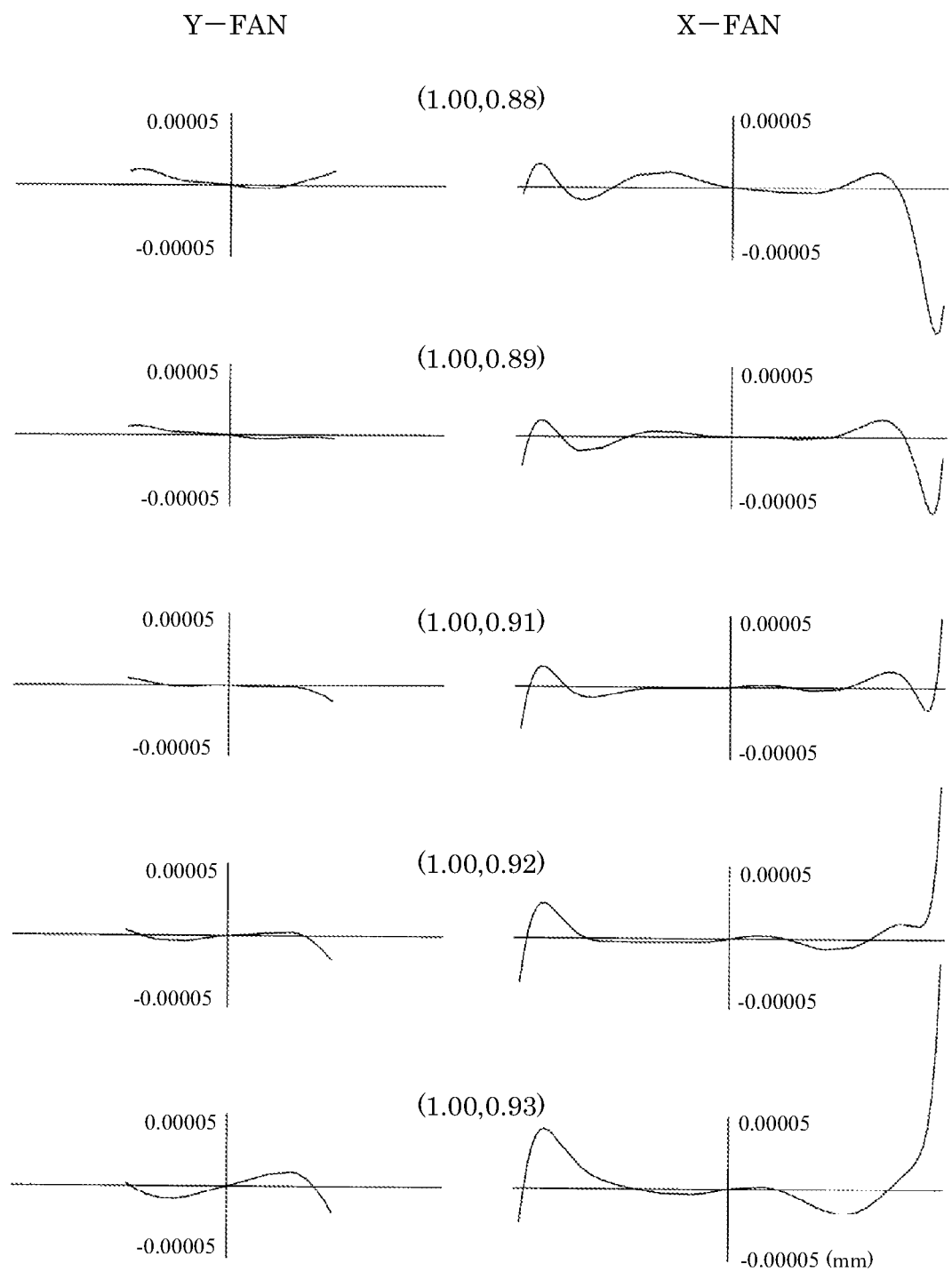
FIG. 7 is a third diagram showing the lateral aberration in the first embodiment.

FIGS. 5, 6 and 7 are diagrams showing the lateral aberration in the first embodiment. In the aberration diagrams, (X, Y) shows the normalized coordinate system in the effective image area. As apparent from the aberration diagrams shown in FIGS. 5-7, it is appreciated that in the first embodiment, the aberration is satisfactorily corrected with respect to a EUV light having a wavelength of 13.5 nm although a large image-side numerical aperture (NAx=0.4) is secured in the X-direction. Note that the manner of indication in the aberration diagrams of FIGS. 5-7 is same also in aberration diagrams shown in FIGS. 10-12 discussed below.

Further, when an average value of angles defined between main light beams corresponding to respective points in the circular arc-shaped illumination area formed on the mask 4 and a perpendicular line on the first plane on which the mask 4 is arrange is "α", and the maximum numerical aperture, of the imaging optical system, on a side of the mask 4 (side of first plane) is "NAmax", the following conditional expression (b) is satisfied:

$$NAmax > \sin \alpha \quad (b)$$

The average value "α" can be an average of angles each of which is defined between the perpendicular line and the main light beam corresponding to one of the respective points, and the average value "α" may be the average of these angles. Note that the respective points described above are representative points inside the circular arc-shaped illumination area, and may be, for example, the center point in the circular arc-shaped illumination area and a most peripheral point in the circular arc-shaped illumination area.

The conditional expression (b) corresponds to the fact that the numerical aperture in the X-direction is set to be great with respect to the average value of the incident angles to the mask 4. Further, the conditional expression (b) corresponds to the fact that an incident angle of component of incident light in the Y-direction, included in the incident light, becomes great with respect to an incident angle of component of incident light in the X-direction, due to the purpose of realizing the light separation in the imaging optical system.

Note that in a case wherein the main light beam of the incident light is not perpendicular to a surface of the mask 4 or a surface of the wafer 7, the numerical aperture is defined in following manner: namely, when a semicircle having a radius 1 is virtually drawn from the center of an incident light incoming into the surface of the mask 4 or the surface of the wafer 7 and an area in which the semicircle and the incoming light flux are overlapped with each other is projected perpendicularly (orthogonally projected) onto the surface of the mask 4 or the surface of the wafer 7, the numerical aperture is defined by a distance between the center of the projected area (for example, circle) and the outer circumference of the projected area (for example, the distance is the radius in a case that the projected area is a circle). On the other hand, in a case that the project area is an ellipse, the numerical aperture is different between the major and minor axes, and the numerical aperture is either the major axis or the minor axis.

Second Embodiment

Figure 8:
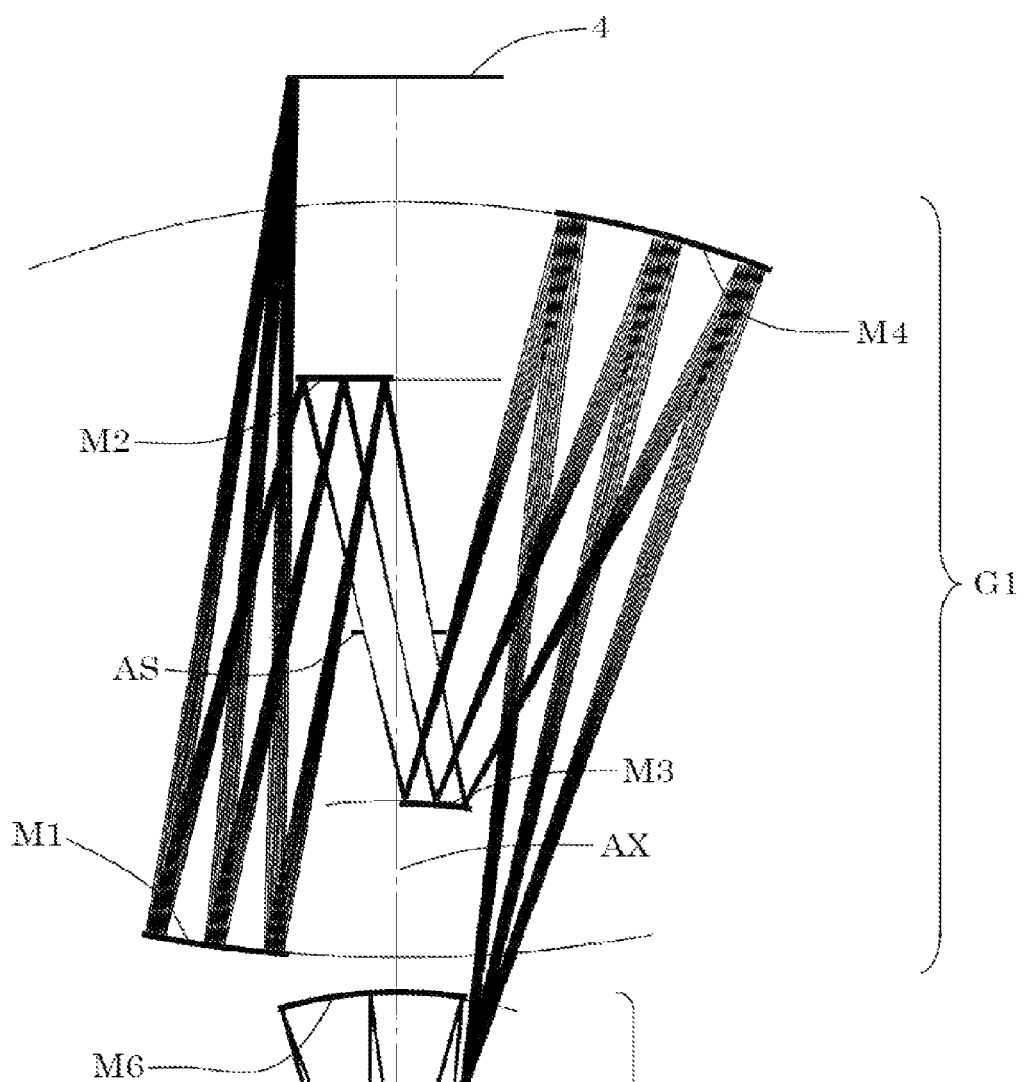
FIG. 8 schematically shows a construction along an YZ plane of an imaging optical system according to a second embodiment.
Figure 9:
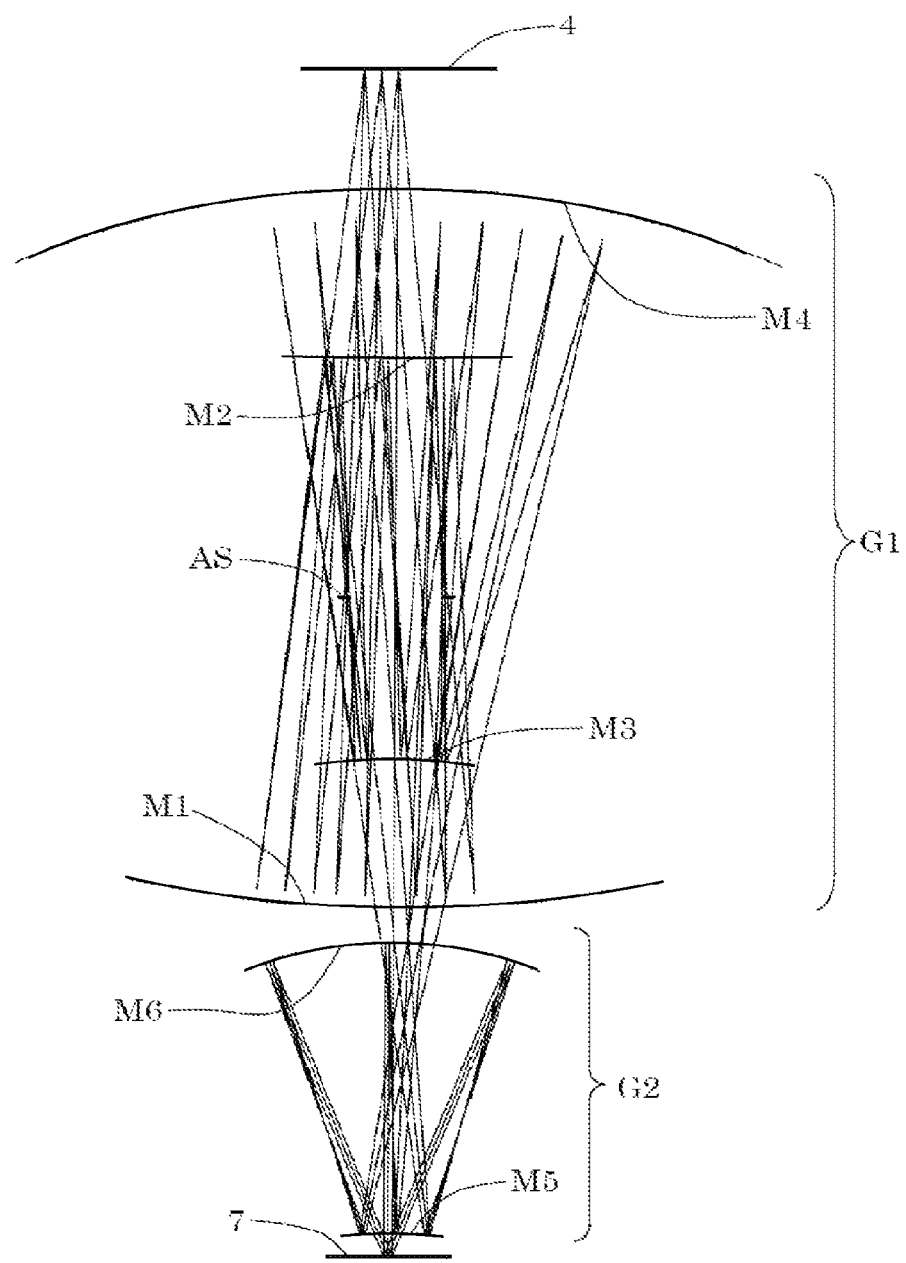
FIG. 9 schematically shows a construction along a XZ plane of the imaging optical system according to the second embodiment.

FIG. 8 schematically shows a construction along an YZ plane of the imaging optical system according to the second embodiment; and FIG. 9 schematically shows a construction along a XZ plane of the imaging optical system according to the second embodiment. In TABLE (2) described below shows values of items or elements of the imaging optical system according to the second embodiment.

TABLE 2

Major Items:

$\lambda$ = 13.5 nm
$\beta$ = ¼
NAx = 0.35
NAy = 0.25
Y0 = 41.5 mm

TABLE 2-continued

|     |     |
| --- | --- |
| LX = 26 mm | |
| LY = 2 mm | |
| Dx = 70.5689 mm | |
| Dy = 49.9638 mm | |

Set Value of Ray Tracing:

| DIM | MM | | | | |
| --- | --- | --- | --- | --- | --- |
| WL | 13.50 | | | | |
| XOB | 0.00000 | 0.00000 | 0.00000 | 0.00000 | 0.00000 |
|  | 6.50000 | 6.50000 | 6.50000 | 6.50000 | 6.50000 |
|  | 13.00000 | 13.00000 | 13.00000 | 13.00000 | 13.00000 |
| YOB | 41.50000 | 41.00000 | 40.50000 | 40.00000 | 39.50000 |
|  | 40.97499 | 40.47499 | 39.97499 | 39.47499 | 38.97499 |
|  | 39.35688 | 38.85688 | 38.35688 | 37.85688 | 37.35688 |

Lens Data:

|     | RDY | THI | RMD |
| --- | --- | --- | --- |
| OBJ: | INFINITY | 0.000000 | |
| 1: | INFINITY | 527.112108 | |
| 2: | −586.28043 | −487.112108 | REFL |
| ASP: | | | |

K: 0.000000
A: −.236164E−10    B: −.110626E−15    C: −.284530E−21    D: −.544786E−26
E: 0.122403E−30    F: −.189106E−35    G: 0.112384E−40    H: 0.000000E+00
J: 0.000000E+00
XDE: 0.000000    YDE: 0.023322    ZDE: 0.000000    DAR
ADE: 0.001515    BDE: 0.000000    CDE: 0.000000

|     |     |     |     |
| --- | --- | --- | --- |
| 3: | −684.71542 | 1760.000000 | REFL |
| ASP: | | | |

K: 0.000000
A: −.396159E−08    B: −.632367E−13    C: −.653539E−18    D: 0.253964E−21
E: −.692815E−25    F: 0.989160E−29    G: −.596456E−33    H: 0.000000E+00
J: 0.000000E+00
XDE: 0.000000    YDE: 0.009293    ZDE: 0.000000    DAR
ADE: 0.000924    BDE: 0.000000    CDE: 0.000000

|     |     |     |     |
| --- | --- | --- | --- |
| 4: | −1401.87799 | −962.106539 | REEL |
| ASP: | | | |

K: 0.000000
A: 0.344061E−13    B: −.777174E−19    C: −.235587E−23    D: 0.104955E−28
E: −.323960E−34    F: 0.517487E−40    G: −.351408E−46    H: 0.000000E+00
J: 0.000000E+00
XDE: 0.000000    YDE: 0.228380    ZDE: 0.000000    DAR
ADE: 0.005863    BDE: 0.000000    CDE: 0.000000

|     |     |     |     |
| --- | --- | --- | --- |
| 5: | −682.83983 | 270.501910 | REFL |
| ASP: | | | |

K: 0.000000
A: 0.129775E−08    B: −.134507E−14    C: 0.421784E−19    D: −.278865E−23
E: −.509373E−29    F: 0.103118E−31    G: −.381436E−36    H: 0.000000E+00
J: 0.000000E+00
XDE: 0.000000    YDE: 0.135445    ZDE: 0.000000    DAR
ADE: 0.002567    BDE: 0.000000    CDE: 0.000000

|     |     |     |     |
| --- | --- | --- | --- |
| STO: | INFINITY | 405.127751 | |

XDE: 0.000000    YDE: 0.236494    ZDE: 0.000000    DAR
ADE: 0.000000    BDE: 0.000000    CDE: 0.000000

|     |     |     |     |
| --- | --- | --- | --- |
| 7: | 43553.22016 | −926.411013 | REFL |
| ASP: | | | |

K: 0.000000
A: 0.275599E−09    B: −.938191E−16    C: 0.115376E−20    D: 0.163736E−24
E: −.956816E−29    F: 0.276251E−33    G: −.320812E−38    H: 0.000000E+00
J: 0.000000E+00
XDE: 0.000000    YDE: 0.207241    ZDE: 0.000000    DAR
ADE: 0.003758    BDE: 0.000000    CDE: 0.000000

|     |     |     |     |
| --- | --- | --- | --- |
| 8: | 1921.64574 | 1412.887892 | REFL |
| ASP: | | | |

K: 0.000000
A: 0.122524E−10    B: 0.531596E−17    C: −.102435E−22    D: 0.192287E−27
E: −.152511E−32    F: 0.621001E−38    G: −.102035E−43    H: 0.000000E+00
J: 0.000000E + 00
XDE: 0.000000    YDE: 0.187309    ZDE: 0.000000    DAR
ADE: 0.002261    BDE: 0.000000    CDE: 0.000000

TABLE 2-continued

| IMG: | INFINITY | 0.000000 | |
|---|---|---|---|
| XDE: 0.000000 | YDE: 0.249032 | ZDE: 0.000000 | DAR |
| ADE: 0.000000 | BDE: 0.000000 | CDE: 0.000000 | |

Figure 10:
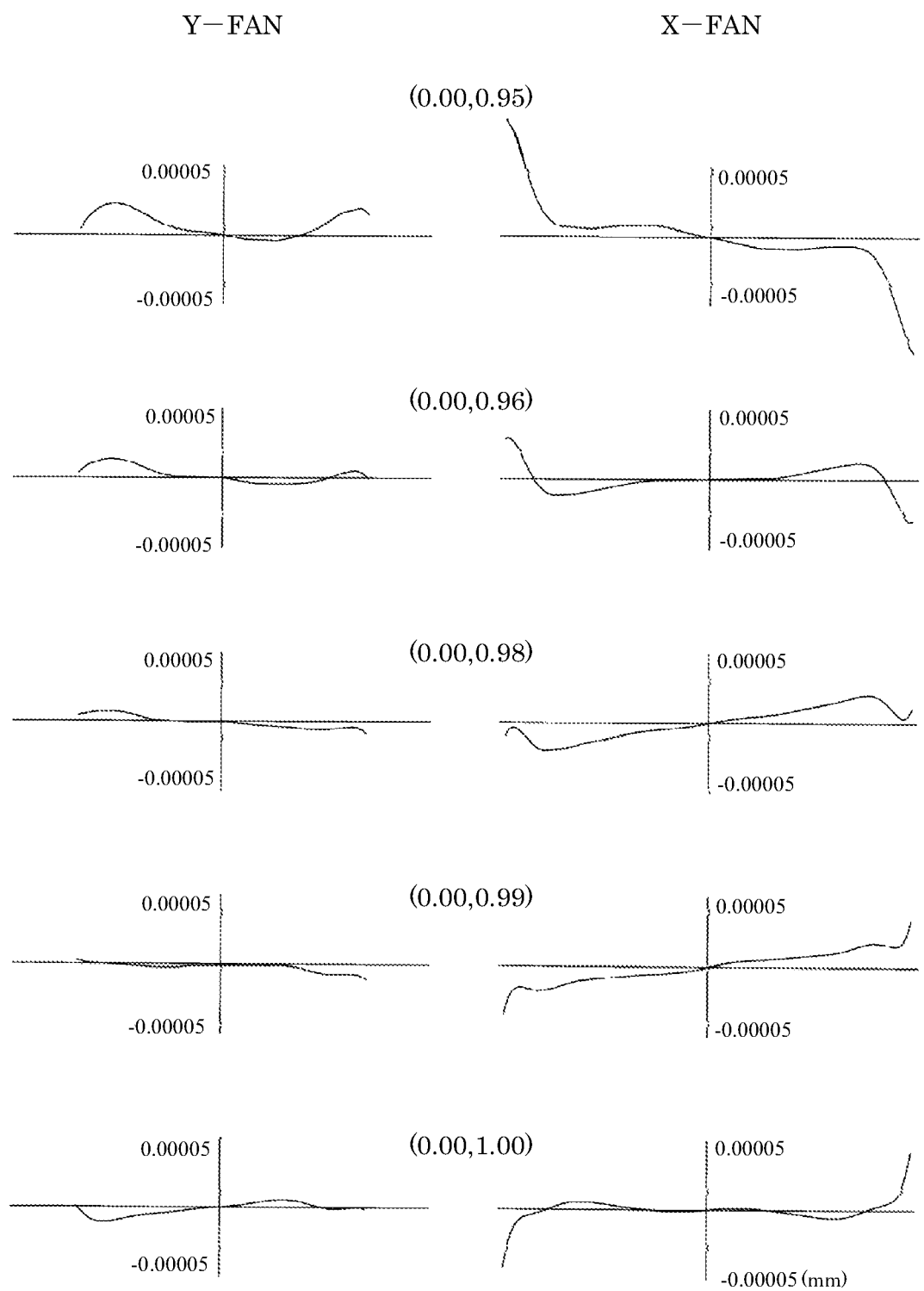
FIG. 10 is a first diagram showing the lateral aberration in the second embodiment.
Figure 11:
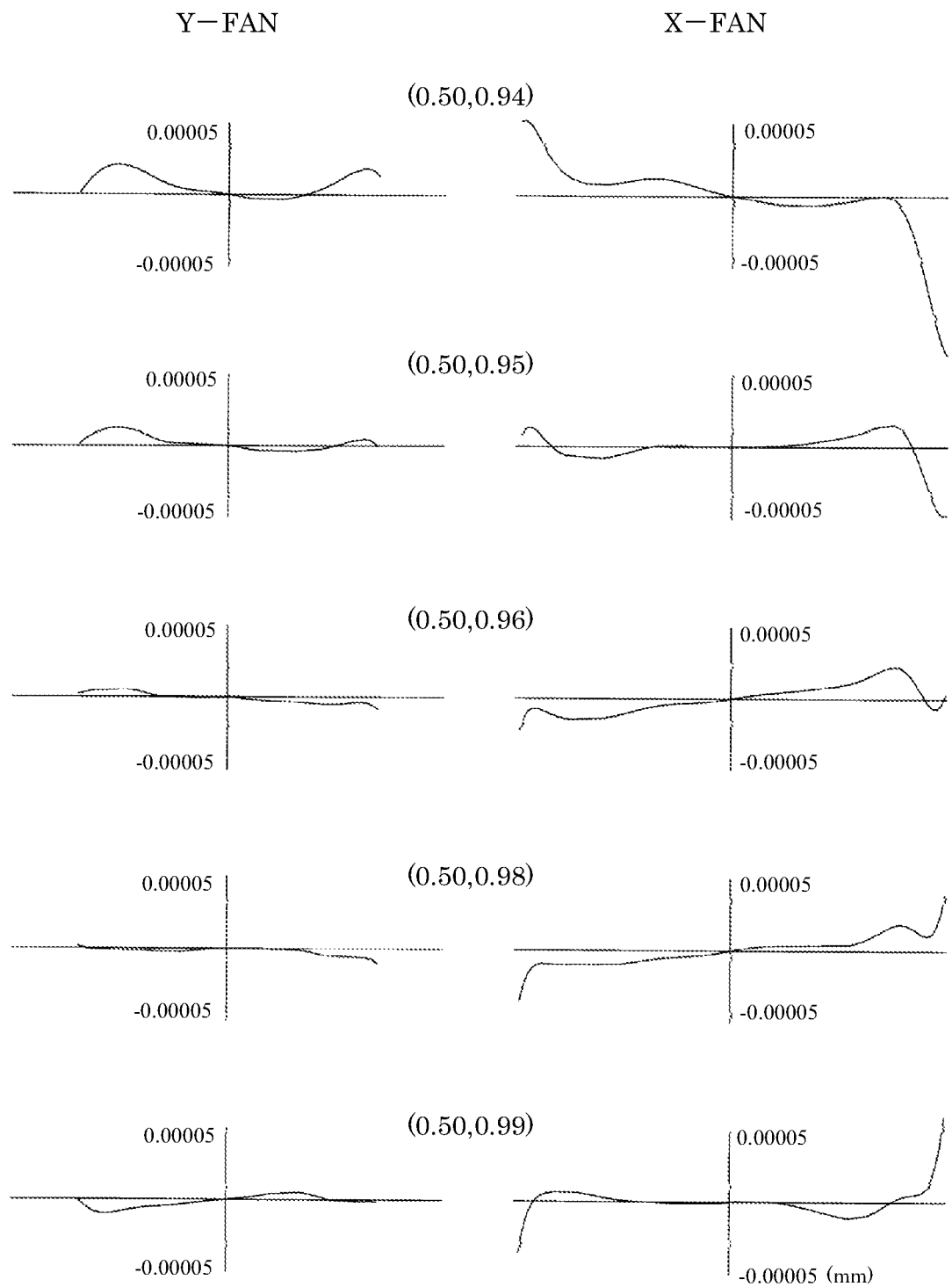
FIG. 11 is a second diagram showing the lateral aberration in the second embodiment.
Figure 12:
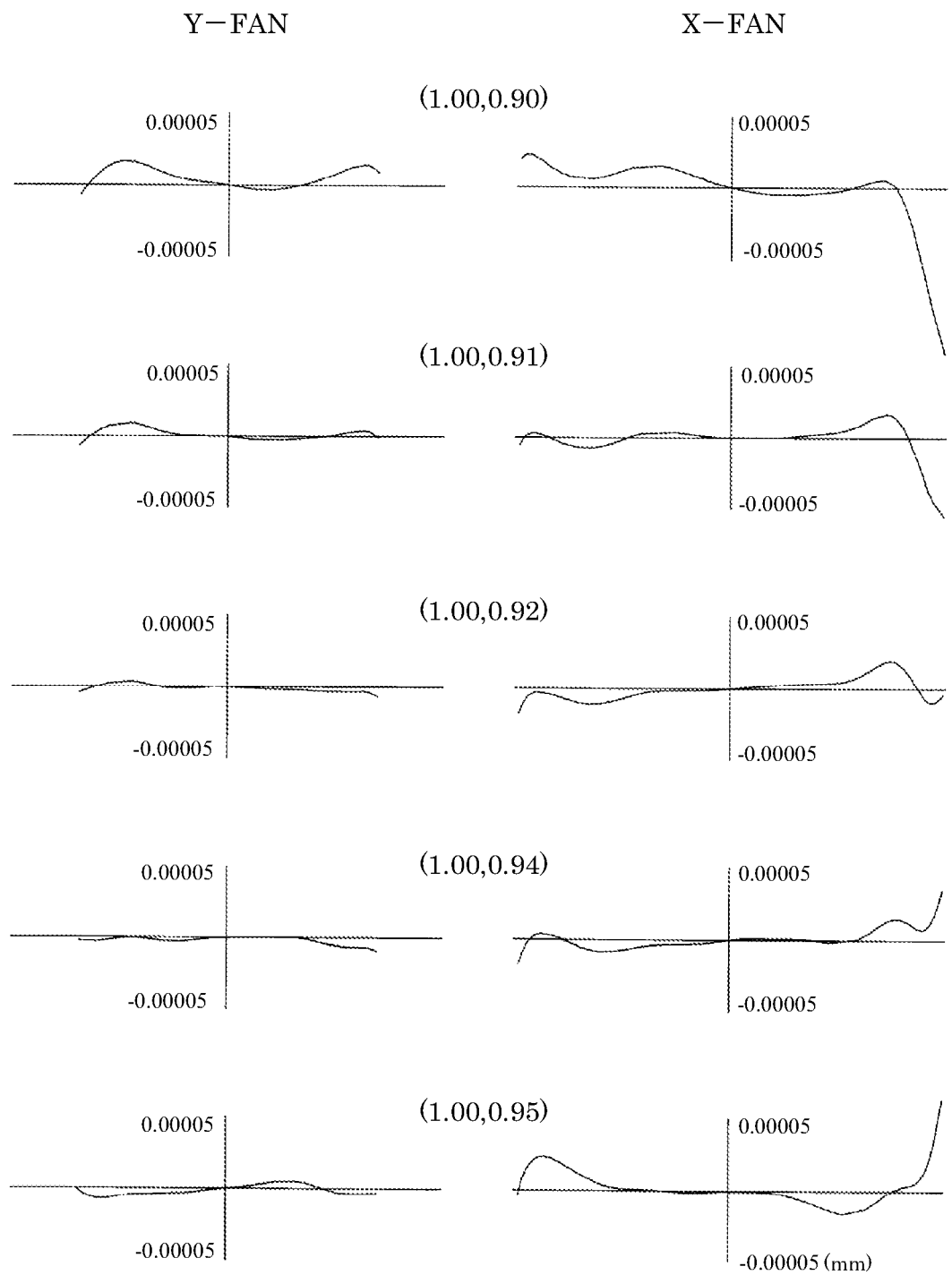
FIG. 12 is a third diagram showing the lateral aberration in the second embodiment.

FIGS. 10, 11 and 12 are diagrams showing the lateral aberration in the second embodiment. As apparent from the aberration diagrams shown in FIGS. 10-12, it is appreciated that in the second embodiment, the aberration is satisfactorily corrected with respect to a EUV light having a wavelength of 13.5 nm although a large image-side numerical aperture (NAx=0.35) is secured in the X-direction.

As apparent from the comparison between FIGS. 3 and 4 and the comparison between FIGS. 8 and 9, an reflective imaging optical system normally has a design in which the light flux is folded (bent) along a plane (YZ plane) including the optical axis AX and the radial direction (Y direction) passing through the center of the circular arc-shaped effective imaging area ER on the wafer 7. This is because, in the vicinity of the object plane, it is easy to fold the light flux in a narrow direction in which the circular arc-shaped illumination area on the mask 4 is narrow (Y direction); and in the vicinity of the image plane it is easy to fold the light flux in a narrow direction in which the circular arc-shaped effective imaging area ER is narrow (Y direction).

In the present invention, although it is difficult to increase the numerical aperture with respect to the direction for folding the light flux (Y direction) in view of the above consideration, the knowledge is obtained that it is relatively easy to realize increase in the numerical aperture with respect to, for example, a direction orthogonal (generally crossing) the direction for folding the light flux. In each of the embodiments, based on this knowledge, the elliptic-shaped opening is provided on the aperture stop AS which defines the numerical aperture NA on the image side (on the side of the second plane) and the size Dx in the major axis direction (X direction) of the opening is made to be a predetermined times greater than the size Dy of the opening in the minor axis direction (Y direction), thereby securing the image-side numerical aperture NAx in the X-direction to be larger than the image-side numerical aperture NAy in the Y-direction and consequently realizing the increase in the image-side numerical aperture NAx in the X direction.

Specifically, in the first embodiment, the major axis size Dx of the elliptic-shaped opening to be approximately 2.02 times (=84.0838/41.6781) of the minor axis size Dy to thereby increase the image-side numerical aperture NAx in the X direction to be as much as 2 times (=0.4/0.2) the image-side numerical aperture NAy in the Y direction. Considering that the conventional technique uses the aperture stop having a substantially circular opening and secures an image-side numerical aperture which is substantially same in every direction, it is appreciated that the first embodiment increases the size of the image-side numerical aperture NAx in the X direction to up to be twice that of the conventional technique.

In the second embodiment, the major axis size Dx of the elliptic-shaped opening to be approximately 1.41 times (=70.5689/49.9638) of the minor axis size Dy to thereby increase the image-side numerical aperture NAx in the X direction to be as much as 1.4 times (=0.35/0.25) the image-side numerical aperture NAy in the Y direction. Namely, it is appreciated that the second embodiment increases the size of the image-side numerical aperture NAx in the X direction to up to be 1.4 times that of the conventional technique.

The respective embodiments provide the elliptic-shaped opening on the aperture stop AS in the reflective imaging optical system, the opening having the minor axis in the Y direction that is the direction in which the light flux is folded, and the size Dx in the major axis direction of the opening is made to be approximately 2.02 times or approximately 1.41 times the size Dy of the opening in the minor axis direction, thereby increasing the image-side numerical aperture NAx in the X-direction to be 2 times or 1.41 times that of the conventional technique. Namely, the respective embodiments realize an imaging optical system which is applicable, for example, to an exposure apparatus using the EUV light and which is capable of realizing the increase in numerical aperture while realizing the optical path separation for the light flux.

Specifically, in the respective embodiments, it is possible to secure the relatively large image-side numerical aperture in the X direction, with respect to the EUV light having wavelength of 13.5 nm which is 0.4 or 0.35 and to secure, on the wafer 7, an effective imaging area which has the circular arc-shape and a size of 26 mm×2 mm and in which the various aberrations are satisfactorily corrected. Therefore, it is possible to transfer the pattern of the mask 4 to each of the exposure areas, in the wafer 7, having for example a size of 26 mm×34 mm or 26 mm×37 mm by means of scanning exposure with a high resolution of not more than 0.1 μm.

In the exposure apparatus of the embodiment, a circuit pattern is subjected to the projection exposure by using the imaging optical system having the image-side numerical aperture NAx in the X direction of which size is 2 times or 1.4 times that of the image-side numerical aperture NAy in the Y direction. Therefore, with respect to a pattern which is to be formed by using the theoretical resolution limitation in a layer called as a critical layer, it is allowable to design the circuit pattern such that the spatial frequency is high (having a small pitch) along the X direction and that the spatial frequency is low (having a large pitch) along the Y direction.

In the respective embodiments described above, the EUV light having the wavelength of 13.5 nm is used as an example. However, there is no limitation to this. The present invention is applicable to, for example, to an imaging optical system which uses a EUV light having wavelength of about 5 nm to about 40 nm or a light having another appropriate wavelength.

Further, in the respective embodiments, the Y direction is coincident with the radial direction passing the center of the circular arc-shaped effective imaging area ER. However, there is no limitation to this. The effects of the present invention can be obtained by making an angle defined by the Y direction and the radial direction passing the center of the circular arc-shaped effective imaging area ER to be less than 30 degrees.

Furthermore, in the respective embodiments, the effective imaging area formed on the wafer 7 is circular arc-shaped. However, there is no limitation to this. For example, a rectangular shaped effective imaging area may also be formed on the wafer 7. In such a case, the effects of the present invention can be obtained by making the Y direction to coincide with a short side direction (narrow side direction) of the rectangular shaped effective imaging area. Alternatively, the effects of the present invention can be obtained by making an angle defined by the Y direction and the narrow side direction of the rectangular shaped effective imaging area to be less than 30 degrees.

Moreover, the present invention is explained by way of example of the reflective imaging optical system of the far pupil type. However, there is no limitation to this. The present invention is applicable similarly to a reflective imaging optical system of the near pupil type. Note that the term "reflective imaging optical system of the near pupil type" is a reflective imaging optical system having the entrance pupil disposed on the side of the optical system with the object plane intervening therebetween.

As described above, it is important in the present invention that, in the reflective imaging optical system which forms an image of the first plane on the second plane, the numerical aperture, with respect to the first direction on the second plane, on a side of the second plane is greater than 1.1 times (more preferably 1.5 times) of a numerical aperture, with respect to the second direction crossing the first direction, on the second plane, on the side of the second plane. Further, in another point of view, it is important in the present invention that, in the reflective imaging optical system which forms an image of the first plane on the second plane, the aperture stop defining the numerical aperture on the side of the second plane is provided; the aperture stop has an elliptic-shaped opening; and the size of the elliptic-shaped opening in the major axis direction is greater than 1.1 times the size of the elliptic-shaped opening in the minor axis direction.

The exposure apparatus of the embodiment described above is produced by assembling the various subsystems including the respective constitutive elements as defined in claims so that the predetermined mechanical accuracy, electric accuracy and optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is preferable that the exposure apparatus is produced in a clean room in which the temperature, the cleanness, etc. are managed.

Figure 13:
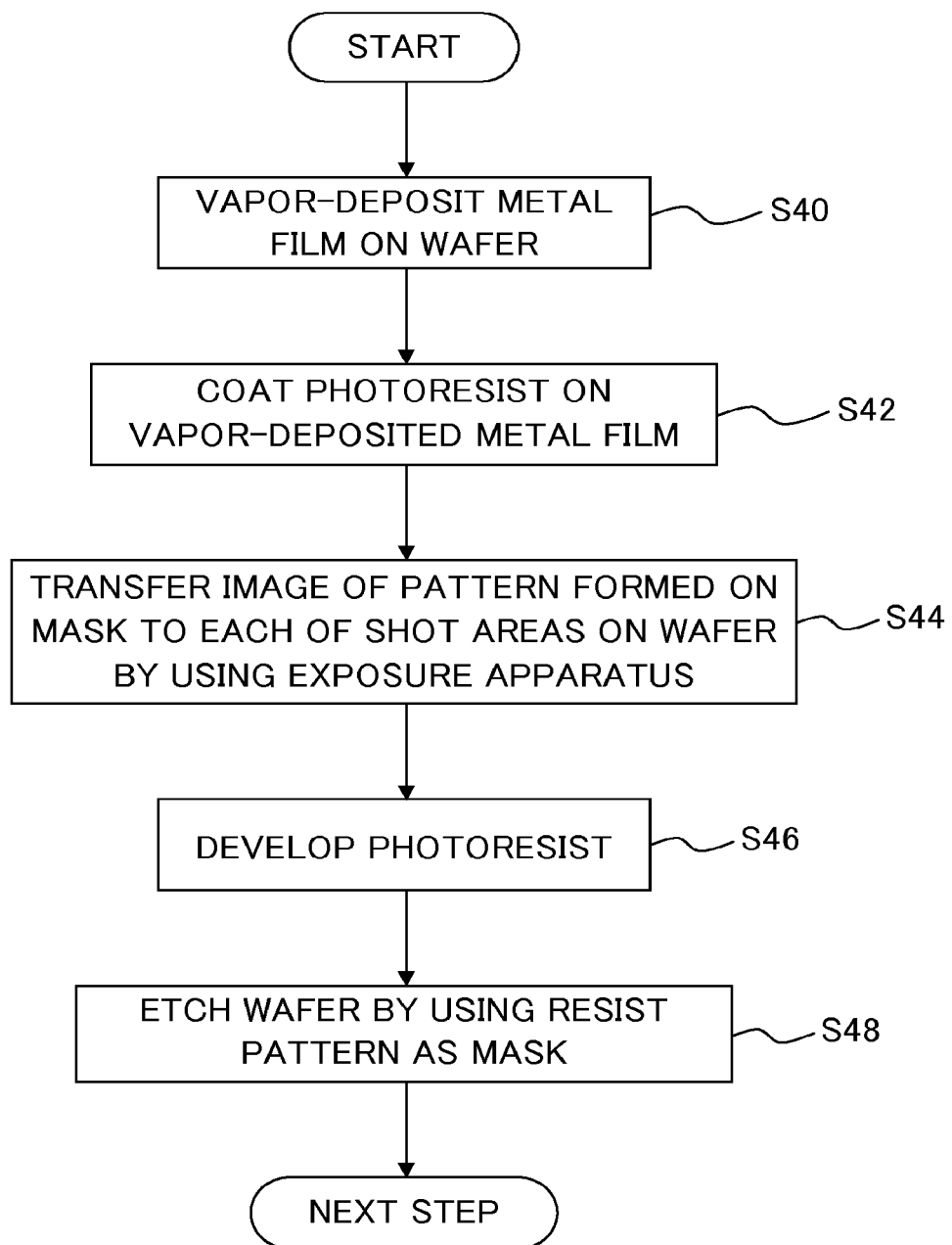
FIG. 13 shows a flow chart concerning an exemplary technique adopted when a semiconductor device is obtained as a microdevice by way of example.

Next, an explanation will be made about a device production method using the exposure apparatus according to the embodiment described above. FIG. 13 shows a flow chart illustrating steps of producing a semiconductor device. As shown in FIG. 13, in the steps of producing the semiconductor device, a metal film is vapor-deposited on a wafer W which is to serve as a substrate of the semiconductor device (Step S40); and a photoresist as a photosensitive material is coated on the vapor-deposited metal film (Step S42). Subsequently, a pattern formed on a mask (reticle) M is transferred to each of shot areas on the wafer W by using the exposure apparatus of the embodiment described above (Step S44: exposure step). The wafer W for which the transfer has been completed is developed, i.e., the photoresist, to which the pattern has been transferred, is developed (Step S46: development step). After that, the resist pattern, which is generated on the surface of the wafer W in accordance with Step S46, is used as a mask to perform the processing including, for example, the etching with respect to the surface of the wafer W (Step S48: processing step).

The resist pattern herein refers to the photoresist layer formed with protrusions and recesses having shapes corresponding to the pattern transferred by the exposure apparatus of the embodiment described above, wherein the recesses penetrate through the photoresist layer. In Step S48, the surface of the wafer W is processed via the resist pattern. The processing, which is performed in Step S48, includes, for example, at least one of the etching of the surface of the wafer W and the film formation of a metal film or the like. In Step S44, the exposure apparatus of the embodiment described above transfers the pattern by using, as the photosensitive substrate, the wafer W coated with the photoresist.

In the embodiment described above, the laser plasma X-ray light source is used as the light source for supplying the EUV light. However, there is no limitation to this. It is also possible to use, for example, the synchrotron radiation (SOR) light as the EUV light.

In the embodiment described above, the present invention is applied to the exposure apparatus having the light source for supplying the EUV light. However, there is no limitation to this. The present invention is also applicable to an exposure apparatus having a light source for supplying a light having any wavelength other than the EUV light.

In the embodiment described above, the present invention is applied to the imaging optical system provided as the projection optical system of the exposure apparatus. However, there is no limitation to this. In general, the present invention is also applicable similarly or equivalently to any reflective imaging optical system which generally forms an image of a first plane on a second plane.

Further, in the embodiments, although the present invention is applied to the reflective imaging optical system of which all the optical elements are constructed only of the reflecting mirrors, the present invention is also applicable to an imaging optical system in which a part of the optical elements is a refractive optical element or a diffractive optical element (reflective type-diffractive optical element or transmissive type-diffractive optical element).

DESCRIPTION OF REFERENCE NUMERALS

1: laser plasma X-ray light source
2a, 2b: fly's eye optical system
3: oblique incidence mirror
4: mask
5: mask stage
6: imaging optical system
7: wafer
8: wafer stage
IL: illumination optical system
G1, G2: reflective optical system
M1 to M6: reflecting mirror

The invention claimed is:

1. An exposure apparatus comprising:
   an illumination optical system which includes a fly's eye optical system including a plurality of reflecting elements arranged on an arrangement plane, and which is configured to illuminate a pattern formed on a reflective-type mask arranged on a first plane with a radiation from the fly's eye optical system; and
   a projection optical system configured to form an image of the pattern on a substrate arranged on a second plane by using a radiation from the pattern,
   wherein an illumination area of the illumination optical system is formed on the first plane at a position deviated from an optical axis of the projection optical system in a first direction;
   wherein an entrance pupil of the projection optical system has a size in the first direction and a size in a second direction crossing the first direction, the size in the second direction being larger than the size in the first direction;
   wherein a radiation emitted from the illumination optical system so as to travel toward the illumination area is inclined with respect to the optical axis of the projection optical system; and
   the radiation from the pattern coming into the projection optical system from the illumination area is inclined with respect to the optical axis of the projection optical system.

2. The exposure apparatus according to claim 1, wherein the fly's eye optical system is positioned at a side of the first direction of the projection optical system.

3. The exposure apparatus according to claim 2, wherein the radiation from the fly's eye optical system is inclined with respect to the optical axis of the projection optical system.

4. The exposure apparatus according to claim 3, wherein the illumination optical system includes a mirror configured to reflect the radiation from the fly's eye optical system toward the illumination area.

5. The exposure apparatus according to claim 1, wherein the fly's eye optical system is configured to receive a radiation from a light source positioned at the side of the first direction of the optical axis of the projection optical system.

6. The exposure apparatus according to claim 1, wherein the projection optical system is configured to form the image of the pattern at a position deviated from the optical axis of the projection optical system in the first direction.

7. The exposure apparatus according to claim 6, further comprising:
   a mask stage configured to hold the reflective-type mask; and
   a substrate stage configured to hold the substrate,
   wherein the exposure apparatus is configured to expose the image of the pattern while moving the mask stage and the substrate stage along the first direction or a third direction opposite to the first direction.

8. The exposure apparatus according to claim 1, wherein the projection optical system includes:
   a first reflection optical system configured to form an intermediate image of the pattern; and
   a second reflection optical system configured to form an image of the intermediate image on the substrate,
   wherein the intermediate image is formed at a side of a third direction of the optical axis of the projection optical system, the third direction being opposite to the first direction.

9. The exposure apparatus according to claim 8, wherein the first reflection optical system includes an aperture stop.

10. An exposure method comprising:
    illuminating, by the illumination optical system included in the exposure apparatus as defined in claim 1, the illumination area on the reflective-type mask;
    forming, by using the projection optical system included in the exposure apparatus, the image of the pattern of the reflective-type mask on the substrate; and
    exposing the pattern onto the substrate while moving the reflective-type mask and the substrate in a direction along an axis connecting the illumination area and the optical axis of the projection optical system.

11. A device manufacturing method comprising:
    exposing, by using the exposure method as defined in claim 10, the pattern onto the substrate;
    developing the substrate to which the pattern has been transferred so as to form a mask layer having a shape corresponding to the pattern on a surface of the substrate; and
    processing the surface of the substrate via the mask layer.

12. The exposure apparatus according to claim 1, wherein a maximum numerical aperture of the projection optical system on a side of the first plane is greater than a sine of an angle between a principal ray, of the radiation from the illumination optical system to the illumination area, corresponding to a point on the illumination area on the first plane and a perpendicular line perpendicular to the first plane.

13. An illumination optical system for an exposure apparatus including a projection optical system configured to form an image of a reflective-type mask on a substrate, the illumination optical system comprising a fly's eye optical system including a plurality of reflecting elements arranged on an arrangement plane,
    wherein the illumination optical system is configured to illuminate a pattern formed on the reflective-type mask with a radiation from the fly's eye optical system,
    wherein an illumination area of the illumination optical system is formed on a first plane at a position deviated from an optical axis of the projection optical system in a first direction;
    wherein an entrance pupil of the projection optical system has a size in the first direction and a size in a second direction crossing the first direction, the size in the second direction being larger than the size in the first direction;
    wherein a radiation emitted from the illumination optical system so as to travel toward the illumination area is inclined with respect to the optical axis of the projection optical system; and
    the radiation from the pattern coming into the projection optical system from the illumination area is inclined with respect to the optical axis of the projection optical system.

14. The illumination optical system according to claim 13, wherein the fly's eye optical system is positioned at a side of the first direction of the projection optical system.

15. The illumination optical system according to claim 14, wherein the radiation from the fly's eye optical system is inclined with respect to the optical axis of the projection optical system.

16. The illumination optical system according to claim 15, wherein the illumination optical system includes a mirror configured to reflect the radiation from the fly's eye optical system toward the illumination area.

17. The illumination optical system according to claim 13, wherein the fly's eye optical system is configured to receive a radiation from a light source positioned at the side of the first direction of the optical axis of the projection optical system.

18. The illumination optical system according to claim 13, wherein a maximum numerical aperture of the projection optical system on a side of the first plane is greater than a sine of an angle between a principal ray, of the radiation from the illumination optical system to the illumination area, corresponding to a point on the illumination area on the first plane and a perpendicular line perpendicular to the first plane.

* * * * *